Oct. 24, 1961 E. W. GRANT 3,005,958
TEMPERATURE-SENSITIVE BIAS NETWORK
Filed June 26, 1958
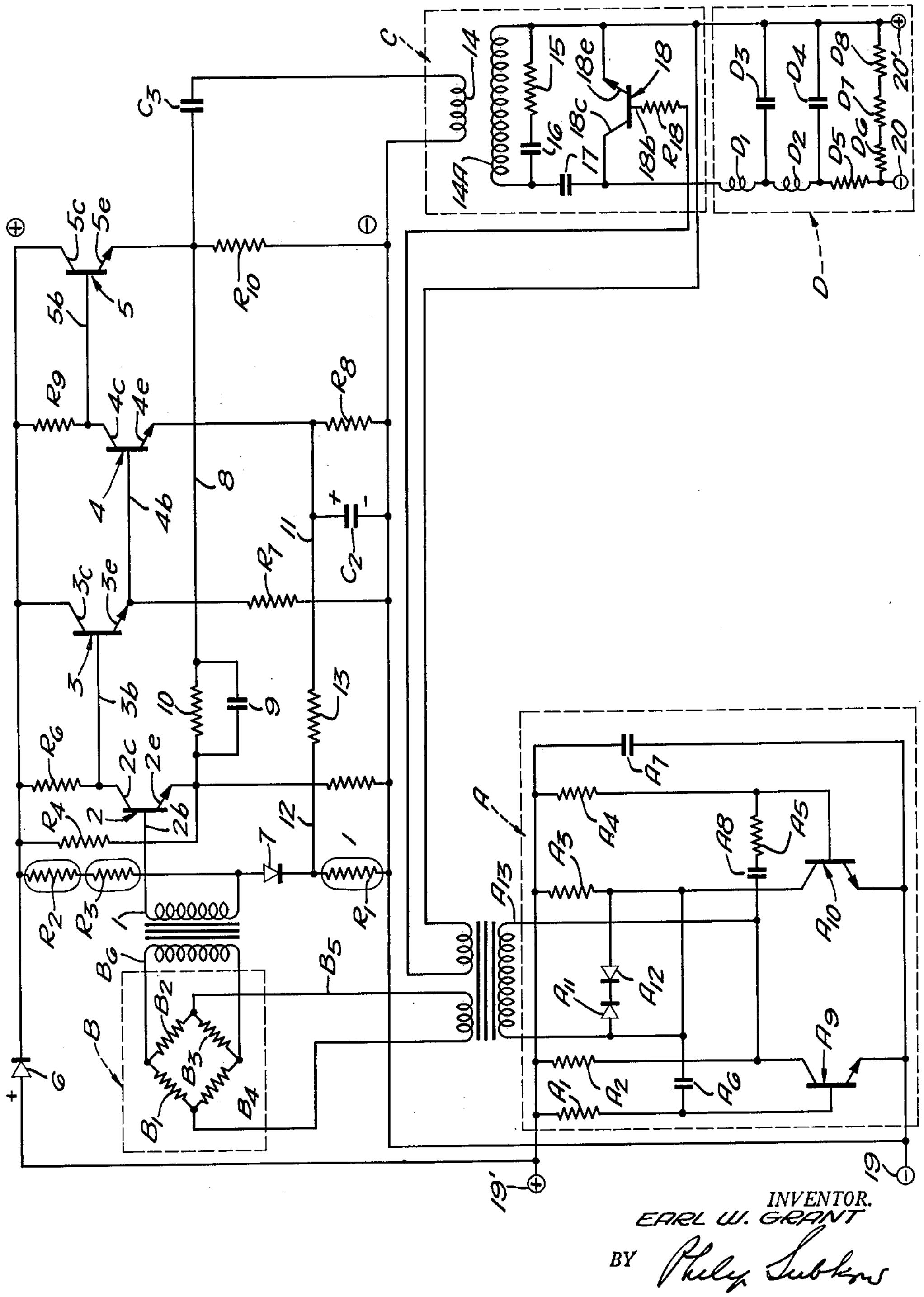
INVENTOR.
EARL W. GRANT
BY Philip Sublow
ATTORNEY United States Patent Office 3,005,958

Patented Oct. 24, 1961

3,005,958
TEMPERATURE-SENSITIVE BIAS NETWORK

Earl W. Grant, Los Angeles, Calif., assignor to Statham Instruments, Inc., Los Angeles, Calif., a corporation of California Filed June 26, 1958, Ser. No. 744,759
2 Claims. (Cl. 330—19)

This invention relates to a direct coupled transistor amplifier which has a high degree of temperature stability and is highly linear.

The amplifier of my invention is characterized by employing two stages of amplification, each stage including in series a voltage amplification transistor stage and a following impedance reducing transistor stage. The amplifier includes a negative feed back connection between the emitter electrodes of the first stage amplifying transistor and the emitter electrode of the second stage impedance reducing transistor.

I also may provide a direct current feed back for direct current stabilization between the emitter electrode of the second stage amplifier transistor and base of the first stage amplifying transistor.

When employing such D.C. feed back, I employ a temperature compensating network to control the bias at the base of the first amplifying transistor.

These and other objects of my invention will be further understood by reference to the drawing in which FIG. 1 shows a circuit diagram of amplifier of my invention.

I have for purposes of illustration described my invention by showing its employment in a system in which the input to the amplifier is a modulated carrier frequency in which the modulator is a bridge circuit such as, for example, that of a four-arm unbonded electrical resistance strain gage which modulates a carrier frequency.

As shown in the drawing, the bridge circuit included in the block diagram B composed of resistance elements B1, B2, B3 and B4 has its input connected to a carrier frequency oscillator illustrated by the block A which, as is illustrated, is a convectional square pulse oscillator in the form of a flip flop.

The output from the modulating bridge illustrated in block B is inductively coupled to the input 1 of the amplifier of my invention.

The amplifier is formed of four n-p-n transistors in cascade, composed of the first amplification transistor 2 connected in a common emitter configuration, and first impedance reducing transistor 3, connected in a common collector (emitter-follower) configuration both forming the first amplification stage, second amplification transistor 4 connected in a common emitter configuration and second impedance reducing transistor 5 connected in a common collector (emitter-follower) configuration, both forming the second amplification stage. The base of each transistor is marked with letter *b*, the emitter electrode as *e* and collector electrode *c*. Thus, the input is connected to 2*b*, 2*c* is connected to 3*b*, 3*e* is connected to 4*b* and 4*c* is connected to 5*b*.

It will be observed that the collector of the first stage transistor 2 is connected to the positive through diode 6, and that the collector 2*c* and emitter 2*e* electrodes of the transistor 2 and the collector load resistor R6 are shunted by resistances $R_4$. The voltage divider has an upper leg which consists of resistances $R_2$ and $R_3$ in series and whose lower leg consists of a rectifying diode 7 and resistance $R_1$ connected across the input to the amplifier. The bridge output at B6 is connected to the base 2*b* and between the upper and lower leg of the temperature compensating voltage divider, i.e., between the diode 7 and the resistances $R_2$ and $R_3$. The resistances $R_2$, $R_3$, $R_1$ are selected so that their temperature coefficients are such as to compensate for the temperature coefficient of the remaining network in order that the net change in resistance of $R_2$, $R_3$ and $R_1$ with change in temperature is opposite to that of the remaining portion of the circuit forming the amplifier.

The major consequence of temperature variation is the effect of temperature on conductivity of the semiconductor elements, transistors 2, 3, 4 and 5. The diode 7 and the resistances $R_1$, $R_2$ or $R_3$ are chosen to compensate for changes of conductivity in transistors 2, 3, 4 and 5 and the associated circuitry.

The temperature stability of the circuit as well as its linearity is improved by the negative feed back loop by connecting 5*e* through the condenser 9 shunted by resistance 10, to the emitter electrode 2*e*.

The direct current stability is also increased by the feed back loop 11, connecting through resistance 13 and through the capacitor $C_2$ whose opposite terminal is connected to the positive terminal 19'.

The output of the amplifier appears at 14, connected through condenser $C_3$ across $R_{10}$. The resistances $R_7$ and $R_8$ are emitter resistors and $R_6$ and $R_9$ are load resistances.

I have found that the employment of the feed back loop 8 with or without 11 both improves the stability and linearity of the amplifier, but the use of the feed back loop 11 improves the direct current stability. I have also found that an increase beyond two stages of amplification, each stage including a voltage amplification transistor and impedance reduction transistor with feed back from the last impedance reduction transistor to the first voltage amplification stage similar to that described but employing stages more than two as above results in such a complication that it becomes practically impossible to balance the temperature characteristics of the resistances $R_1$, $R_2$ and $R_3$ to obtain the above described effects.

Also the employment of but one stage including one amplification transistor and one impedance reduction transistor with feed back between the emitter electrodes of the transistors does not result in adequate stability or linearity as compared to the above system.

For completeness, I have shown the output 14 as fed to a synchronous demodulator and filter included in block C, which is claimed in my companion case, Serial No. 744,757, filed June 26, 1958. The output at 14 may be otherwise employed.

As will be observed, the output 14 is inductively coupled to the input of the demodulator 14A shunted by an R. C. network composed of the resistance 15 and capacitor 16. A capacitor 17 is provided connected in series with the network composed of the R. C. network and the input inductance 14A. The base 18*b* of the transistor 18 is connected through resistance $R_{18}$ to the output $A_{13}$ of the carrier frequency oscillator A, which is also connected to the emitter 18*e*. In the above circuit the transistor 18 shorts during one-half cycle of the square wave generated by the pulse oscillator A.

The output from the demodulator C passes through a filter D. Any suitable filter may be employed. I have illustrated one with an M derived section followed by a constant K section, as shown schematically in the block diagram D, in which $D_1$, $D_2$ are inductances, $D_3$ and $D_4$ capacitors, and $D_5$, $D_6$, $D_7$ and $D_8$ resistances. 20 and 20' are the output terminals.

Referring to the carrier frequency oscillator, the symbols as used are conventional; thus, $A_1$, $A_2$, $A_3$, $A_4$ and $A_5$ are resistances, $A_6$, $A_7$ and $A_8$ are capacitors, $A_9$ and $A_{10}$ are shown as n-p-n transistors, $A_{11}$ and $A_{12}$ are diodes. The carrier frequency square wave pulse appears at $A_{13}$.

The modulator shown in block B is illustrated by a resistance bridge made up of resistances $B_1$, $B_2$, $B_3$ and $B_4$ where one or more than one and even all four resistances may be made responsive to some signal as in unbonded strain gage transducers. See, for example, U.S. Patents Nos. 2,573,286, 2,453,549, 2,600,701 and 2,760,-037. The output of the carrier frequency oscillator is connected to the input $B_5$ and the output $B_6$ is inductively coupled to the input 1 of the amplifier.

Illustrating the results obtainable, the following is an example; with 28 volt D.C. excitation at 19, 19', a demodulated output of from 0–5 volts direct current may be obtained at 20—20' with a flat frequency response from 0 to 2000 cycles per second. Thus the amplifier may be used with readily available excitation to amplify a demodulated signal from any variable resistance D.C. circuit such, for example, but not limited to, strain gage transducers of the bonded or unbonded type or any other similar unit in which a variable D.C. voltage results from an imposed signal.

All transistors as illustrated are n-p-n transistors. Transistors of the p-n-p type may also be employed by suitable rearrangement of polarities, as will be understood by those skilled in the art.

While I have described a particular embodiment of my invention for purposes of illustration, it should be understood that various modifications and adaptations thereof may be made within the spirit of the invention as set forth in the appended claims.

I claim:

1. An amplifier circuit comprising a pair of power terminals, four transistor stages, the transistor of each stage having a base, a collector, and an emitter and being connected across said power terminals, a signal input terminal to the first stage, the first one of said transistor stages being connected in common emitter configuration and having a collector load impedance with a resistive component, the second one of said transistor stages being connected in common collector configuration and having an emitter impedance with a resistive component, the collector of the transistor of said first stage being connected to the base of the transistor of said second stage, the third transistor stage being connected in common emitter configuration and having an emitter impedance with a resistive component, the emitter of said second stage transistor being connected to the base of the transistor of said third transistor stage, the fourth transistor stage being connected in common collector configuration, the collector of said third stage transistor being connected to the base of the transistor of said fourth transistor stage, an output terminal connection to one of said power terminals and to the emitter of said fourth stage transistor, an A.C. feedback coupling the emitter of said fourth stage transistor to the emitter of said first stage transistor, a D.C. feedback connection coupling the emitter of said third stage transistor to the base of said first stage transistor, a temperature compensating network comprising a plurality of impedance elements and having an intermediate point coupled to the input terminal of said first transistor providing a temperature coefficient compensating for changes in conductivity of the remaining portion of said amplifier circuit, shunted across the power terminals of said amplifier circuit.

2. In the circuit of claim 1, said temperature compensating network being a temperature sensitive voltage divider having an upper leg including a resistor coupled to the collector power terminal and a lower leg having in series a diode and a resistor coupled to the emitter power terminal, the base of said first mentioned transistor coupled to said signal input terminal and to said voltage divider at a point between said upper and lower legs and said D.C. feedback connection coupled to said base by coupling to said voltage divider at a point between said diode and said last-named resistor.

References Cited in the file of this patent

UNITED STATES PATENTS

| | | |
|---|---|---|
| 2,789,164 | Stanley | Apr. 16, 1957 |
| 2,802,071 | Lin | Aug. 6, 1957 |
| 2,823,312 | Keonjian | Feb. 11, 1958 |
| 2,831,114 | Van Overbeek | Apr. 15, 1958 |
| 2,844,667 | Yaeger | July 22, 1958 |
| 2,866,892 | Barton | Dec. 30, 1958 |
| 2,885,494 | Darlington | May 5, 1959 |

FOREIGN PATENTS

| | | |
|---|---|---|
| 766,744 | Great Britain | Jan. 23, 1957 |
| 201,792 | Australia | May 31, 1956 |

OTHER REFERENCES

Publication, "Transistors in Audio Amplifiers." Published in Wireless World, May 1956, page 82.

Braunbeck: "High-Gain . . . Amplifier," published in Radio Electronics, vol. 27, No. 6, June 1956, pp. 30–31.

Booth: "Transistorized Receiver For Mobile F.M.," Electronics, Nov. 1956, pages 158–161.

Eddins: "A Unique . . . Amplifier," published in 1957, IRE National Radio Convention Record, part 5, pp. 70–74.